(12) United States Patent
Khan et al.

(10) Patent No.: US 10,530,077 B2
(45) Date of Patent: Jan. 7, 2020

(54) CONNECTOR WITH A HOUSING AND ONE OR MORE GROUPS OF CONTACTS FOR A COMPUTING SYSTEM

(71) Applicant: INTEL CORPORATION, Santa Clara, CA (US)

(72) Inventors: Jawad B. Khan, Portland, OR (US); Jorge Ulises Martinez Araiza, Beaverton, OR (US); Michael D. Nelson, Mountain View, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/807,519

(22) Filed: Nov. 8, 2017

(65) Prior Publication Data
US 2019/0044259 A1    Feb. 7, 2019

(51) Int. Cl.
| | |
|---|---|
| H01R 12/00 | (2006.01) |
| H05K 1/00 | (2006.01) |
| H01R 12/70 | (2011.01) |
| H01R 12/72 | (2011.01) |
| H05K 7/14 | (2006.01) |
| H01R 43/20 | (2006.01) |
| H01R 13/26 | (2006.01) |

(52) U.S. Cl.
CPC ....... *H01R 12/7005* (2013.01); *H01R 12/725* (2013.01); *H01R 13/26* (2013.01); *H01R 43/20* (2013.01); *H05K 7/1487* (2013.01)

(58) Field of Classification Search
CPC .. H01R 12/7005; H01R 12/72; H01R 12/725; H01R 12/75; H01R 13/26; H01R 23/70; H01R 43/20; H05K 7/1487

USPC ...................................................... 439/59–62
See application file for complete search history.

(56) References Cited

U.S. PATENT DOCUMENTS

| | | |
|---|---|---|
| 5,398,161 A | 3/1995 | Roy |
| 6,325,636 B1 | 12/2001 | Hipp et al. |
| 8,154,867 B2 | 4/2012 | Shearman |
| 8,547,825 B2 | 10/2013 | Armstrong |
| 8,843,771 B2 | 9/2014 | Wang |
| 9,213,485 B1 | 12/2015 | Hayes et al. |

(Continued)

OTHER PUBLICATIONS

International Search Report and Written Opinion, dated Apr. 20, 2017, issued in related International Application No. PCT/US2017/012859, 13 pages.

(Continued)

*Primary Examiner* — Hae Moon Hyeon
(74) *Attorney, Agent, or Firm* — Schwabe, Williamson & Wyatt, P.C.

(57) ABSTRACT

Embodiments of the present disclosure are directed towards a connector for a memory device in a computing system. In one embodiment, the connector includes a housing having a cavity to receive a mating end of a printed circuit board (PCB). The cavity includes first groups of first contacts arranged along an inside wall of the cavity, to engage with respective second groups of second contacts arranged around the mating end of the PCB. The cavity further includes a bar disposed inside the cavity to bridge the cavity, to receive a notch formed on the mating end of the PCB. A depth of the notch defines a number of the first groups of first contacts to be engaged with a respective number of the second groups of second contacts on the mating end of the PCB.

17 Claims, 14 Drawing Sheets

(56) References Cited

U.S. PATENT DOCUMENTS

| | | | |
|---|---|---|---|
| 9,292,379 | B2 | 3/2016 | Grimsrud et al. |
| 9,396,065 | B2 | 7/2016 | Webb |
| 2004/0073834 | A1 | 4/2004 | Kermaani |
| 2004/0252467 | A1 | 12/2004 | Dobbs et al. |
| 2005/0042893 | A1 | 2/2005 | Debord et al. |
| 2005/0259397 | A1 | 11/2005 | Bash |
| 2005/0279838 | A1* | 12/2005 | Wang .................. G06K 19/077 235/492 |
| 2005/0281010 | A1* | 12/2005 | Wang .................... H05K 1/117 361/752 |
| 2006/0014433 | A1 | 1/2006 | Consoli et al. |
| 2009/0043946 | A1 | 2/2009 | Webb |
| 2010/0090663 | A1 | 4/2010 | Pappas et al. |
| 2010/0122792 | A1 | 5/2010 | Shabbir |
| 2013/0003285 | A1 | 1/2013 | Liang et al. |
| 2014/0268536 | A1 | 9/2014 | Herman et al. |
| 2014/0362515 | A1 | 12/2014 | Pronozuk et al. |
| 2015/0305206 | A1 | 10/2015 | Fukuda et al. |
| 2016/0364143 | A1 | 12/2016 | Webb |
| 2017/0024275 | A1 | 1/2017 | Grimsrud |
| 2017/0262029 | A1 | 9/2017 | Nelson et al. |

OTHER PUBLICATIONS

International Search Report and Written Opinion, dated Nov. 30, 2016, issued in related International Application No. PCT/US2016/022295 13 pages.

Non-Final Office Action dated May 17, 2017, issued in related U.S. Appl. No. 15/068,827, 24 pages.

* cited by examiner

500

502 {

| | | |
|---|---|---|
| GND | | |
| PE[T/X]p0 | PE[T/X]p4 | PE[T/X]p8 |
| PE[T/X]n0 | PE[T/X]n4 | PE[T/X]n8 |
| GND | | |
| PE[T/X]p1 | PE[T/X]p5 | PE[T/X]p9 |
| PE[T/X]n1 | PE[T/X]n5 | PE[T/X]n9 |
| GND | | |
| PE[T/X]p2 | PE[T/X]p6 | PE[T/X]p10 |
| PE[T/X]n2 | PE[T/X]n6 | PE[T/X]n10 |
| GND | | |
| PE[T/X]p3 | PE[T/X]p7 | PE[T/X]p11 |
| PE[T/X]n3 | PE[T/X]n7 | PE[T/X]n11 |
| GND | | |
| CTRL/SB | CTRL/SB | PE[T/X]p12 |
| CTRL/SB | CTRL/SB | PE[T/X]n12 |
| GND | | |
| CTRL/SB | CTRL/SB | PE[T/X]p13 |
| CTRL/SB | CTRL/SB | PE[T/X]n13 |
| GND | | |
| CTRL/SB | CTRL/SB | PE[T/X]p14 |
| CTRL/SB | CTRL/SB | PE[T/X]n14 |
| GND | | |
| CTRL/SB | CTRL/SB | PE[T/X]p15 |
| CTRL/SB | CTRL/SB | PE[T/X]n15 |
| GND | | |
| x4 mode | x8 mode | x16 mode |

504 {

| |
|---|
| GND |
| GND |
| PWR |
| PWR |
| PWR |
| PWR |

*FIG. 5*

CONNECTOR WITH A HOUSING AND ONE OR MORE GROUPS OF CONTACTS FOR A COMPUTING SYSTEM

FIELD

Embodiments of the present disclosure generally relate to the field of computing systems, and more particularly, to connectors for memory cards in a computing system.

BACKGROUND

A computing infrastructure (e.g., a cluster of servers or a data center) may include one or more computing systems, each including a plurality of compute nodes that may comprise various compute structures (e.g., servers and/or storage systems) and may be physically located in multiple sleds, boxes or boards disposed on a computing shelf or computing tray of a rack. In a tray or sled, the compute nodes may be interconnected with other components, such as memory devices, interface cards, serial computer buses or the like, via different connecting devices. For example, memory devices, such as solid state drives (SSD), may be connected with other computing components via Peripheral Component Interconnect Express (PCIe) switches. In some instances, the memory devices (e.g., flash array storage systems such as All Flash Array (AFA)) may include multiple SSD, with each SSD connected to the central processing units (CPUs) in the sled via a PCIe switch. Accordingly, the connectivity between SSD and the PCIe switch may define a data throughput capacity between the memory device and CPU.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 5 illustrates an example configuration of contacts in the connector of FIG. 4, in accordance with some embodiments.

DETAILED DESCRIPTION

Figure 1:
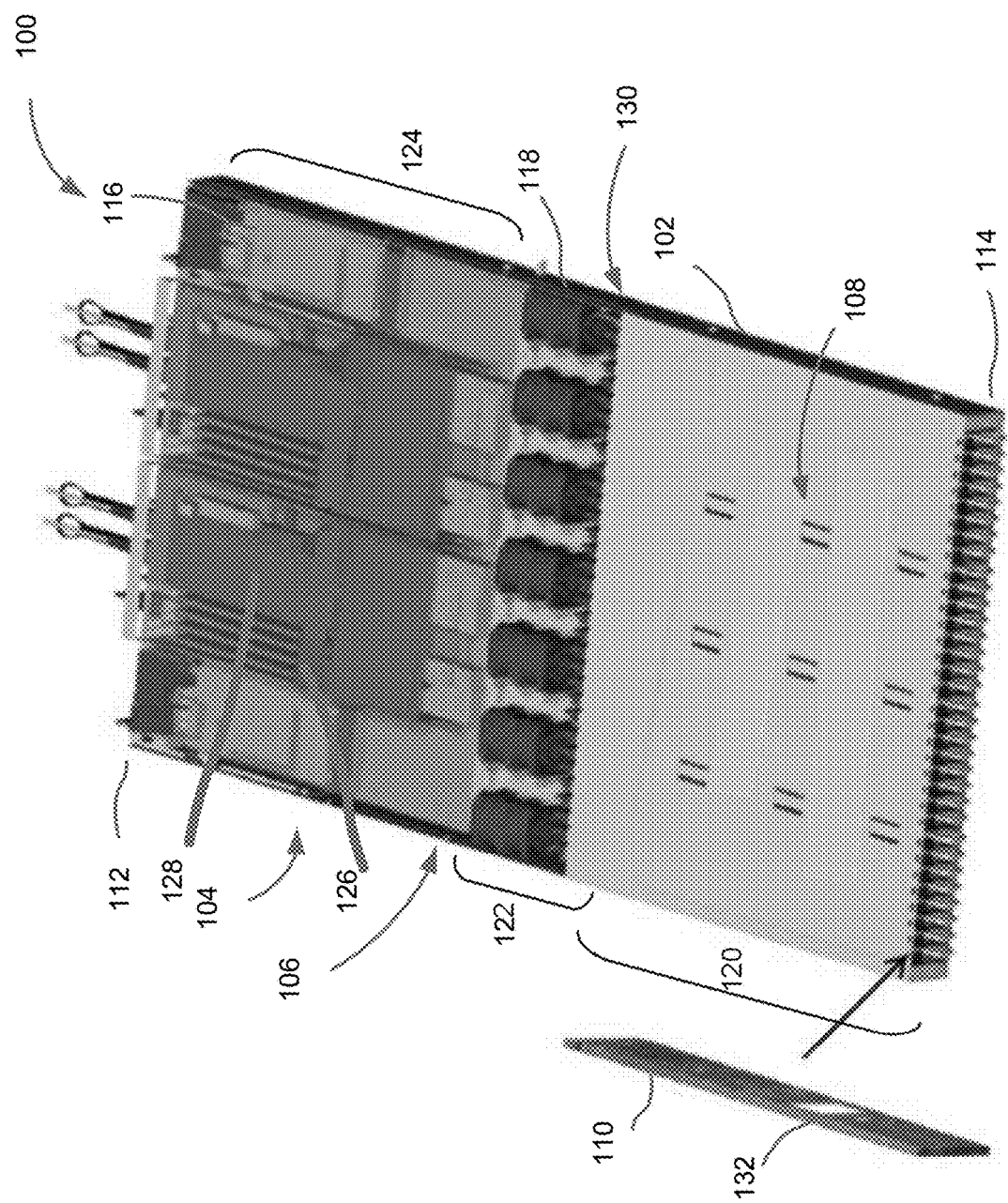
FIG. 1 is an example computing system that may employ a connector provided in accordance with some embodiments.

Embodiments of the present disclosure describe techniques and configurations for a connector for a memory device in a computing system. In some embodiments, the connector may include a housing having a cavity to receive a mating end of a printed circuit board (PCB). The cavity may include first groups of first contacts arranged along an inside wall of the cavity, to engage with respective second groups of second contacts arranged around the mating end of the PCB. The cavity may further include a bar disposed inside the cavity to bridge the cavity, to receive a notch formed on the mating end of the PCB. A depth of the notch may define a number of the first groups of first contacts to be engaged with a respective number of the second groups of second contacts on the mating end of the PCB. In embodiments, the PCB may comprise an AFA SSD memory device. The connector may comprise a PCIe interconnect with Non-Volatile Memory (NVMe) protocol (e.g., PCIe bus), to connect the memory device with other components of the computing system, such as a PCIe switch.

Currently, top serviceable or front mounted storage systems (e.g., AFA, such as NAND or other systems) may be used. The top serviceable model may not be attractive, because a cable management solution may be required at the back of the memory module, which may increase the cost and the rack depth. A preference for the front serviceable SSD modules has been indicated. However, when SSD are used in a storage system, airflow management may become a challenge. Further, larger bus widths may be required for PCIe connectivity, which at the module level implies an increase in the number of pins/connection points the module needs to support. Current solutions include reducing the contact (pin) pitch, which may make it difficult to create a blind mate connector for the memory module. Other solutions propose to increase a height of the connector, which may not fit in the desired height of the box, sled or tray on the rack. The described embodiments address these and other issues related to memory storage systems.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is an example computing system that may employ a connector provided in accordance with some embodiments. More specifically, system 100 may be an example of a disaggregated storage system that may be used in a computing system, such as a data center, server cluster, server farm, or the like. The connectors configured according to the embodiments of the present disclosure may provide connectivity between the memory components of the system 100 and other components, such as switches, as described below in detail.

The system 100 may have front or top serviceability of an array of flash storage modules, as well as desired airflow characteristics. In embodiments, the system 100 may be mounted to a sliding carrier (box) 102 to allow for other modules to be serviced without removing the chassis, such as fans, interconnects, controllers, switches, and computing modules. In embodiments, the system 100 may comprise a box (e.g., enclosure) that may be insertable into or removable from a tray or a sled in a computer rack.

In embodiments, the memory storage system 100 may include a plurality of memory cards 110 (provided in a form of a PCB). As shown, the memory cards (PCB) 110 may include a memory chip 132 and associated circuitry (not shown). In embodiments, the memory cards (PCB) 110 may comprise a thin and long SSD form factor, e.g., shaped as a ruler. In embodiments, the box 102 may carry a system module PCB 104 proximate the rear 112 of the box 102, a midplane PCB 118 near the middle 106 of the box 102 and an array 108 of memory cards (PCB) 110 disposed in a memory card zone 120 proximate the front 114 of the box 102. An array of fans (not shown) may be mounted to the front 114 of the box 102 to draw air into the box and push it between and across the memory cards (PCB) 110 and to the rear 112 of the box 102. One or more power supplies 116 may be mounted at the rear 112 of the box 102 and may also have fans (not shown) to draw air from the box 102 and push it out the rear 112 of the box 102.

In the memory card zone 120, the parallel memory cards (PCB) 110 may extend from a position proximate the front 114 of the enclosure toward the rear of the box 102. A switching zone 122 proximate the front 114 of the enclosure may be connected to the memory cards to carry a switch fabric. The rear zone 124 may include power supply and management between the memory card zone 120 and the rear 112 of the box 102. The rear zone 124 may carry the switch fabric, for example, switches 126, such as PCIe switches. The rear zone 124 may also include interfaces 128 (e.g., network interface cards) which may interface with respective compute nodes (not shown). The compute nodes may perform computations using values stored in the memory card zone 120.

In some embodiments, the switching zone 122 may include one or more connectors 130 configured to provide connections between the memory cards (PCB) 110 and other components of the computing system (e.g., switches 126, interfaces 128, and/or compute nodes) according to the embodiments of the present disclosure.

Figure 2:
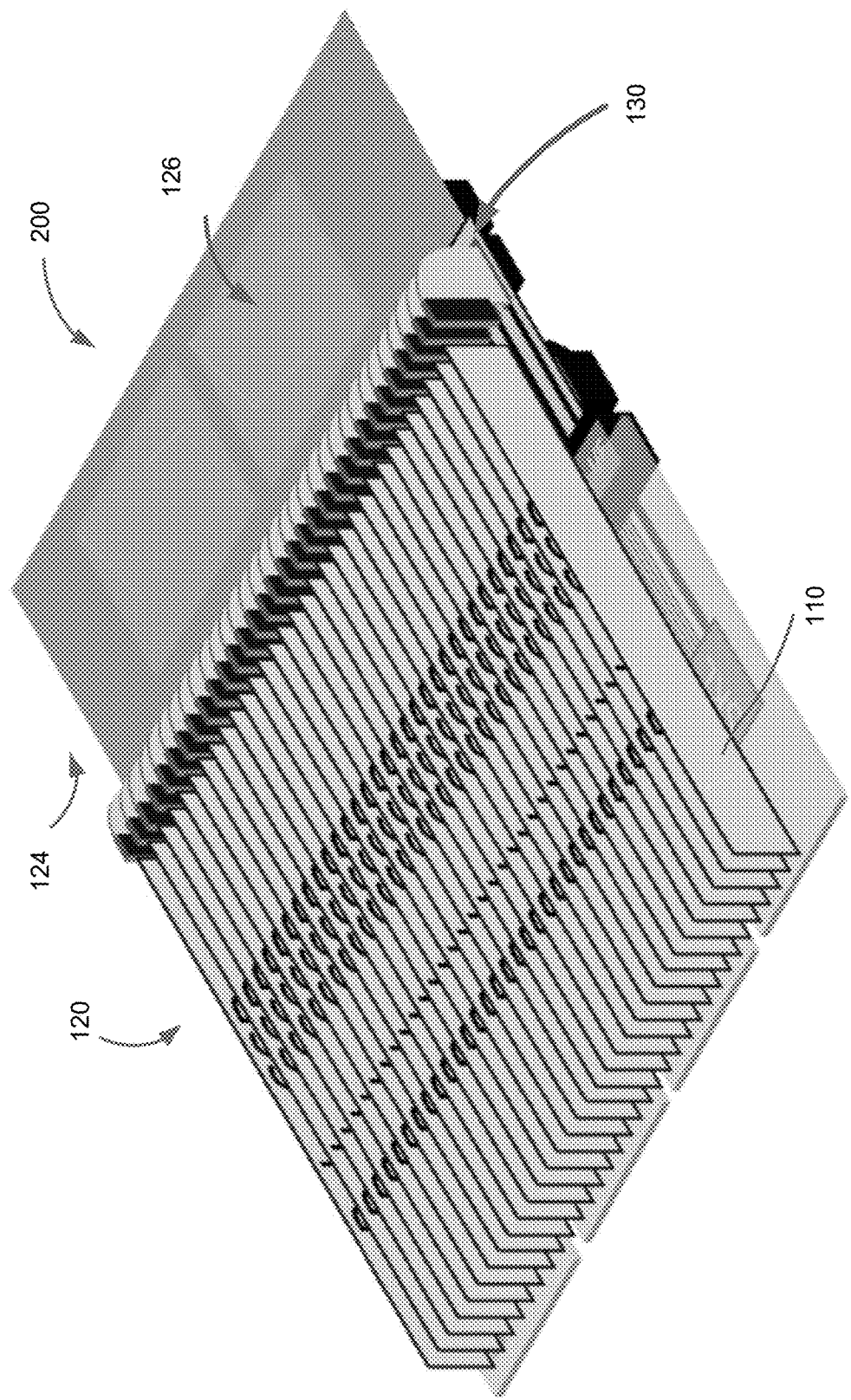
FIG. 2 illustrates some aspects of the example computing system of FIG. 1, in accordance with some embodiments.

FIG. 2 illustrates some aspects of the example computing system of FIG. 1, in accordance with some embodiments. For purposes of explanation, like components of FIGS. 1 and 2 (and subsequent figures) are indicated by like numerals. More specifically, FIG. 2 illustrates a portion 200 of the system 100, with the memory card zone 120 with a plurality of parallel memory cards (PCB) 110 disposed in the memory card zone 120 parallel and adjacent to each other, as shown. Such disposition of memory cards (PCB) 110 may provide for high storage density, and desired airflow and heat dissipation characteristics.

The portion 200 may further include multiple switches 126 disposed in the rear zone 124. In embodiments, the memory cards (PCB) 110 may be connected with the switches 126 using the connectors 130 provided in accordance with the embodiments of this disclosure.

The system 100 employing multiple memory cards (PCB) 110 with connectors 130 may provide for increased connectivity (e.g., PCIe connectivity) without further reduction of a contact (pin) pitch, and for retaining the horizontal mount of the system, its front serviceability and airflow characteristics.

Figure 3:
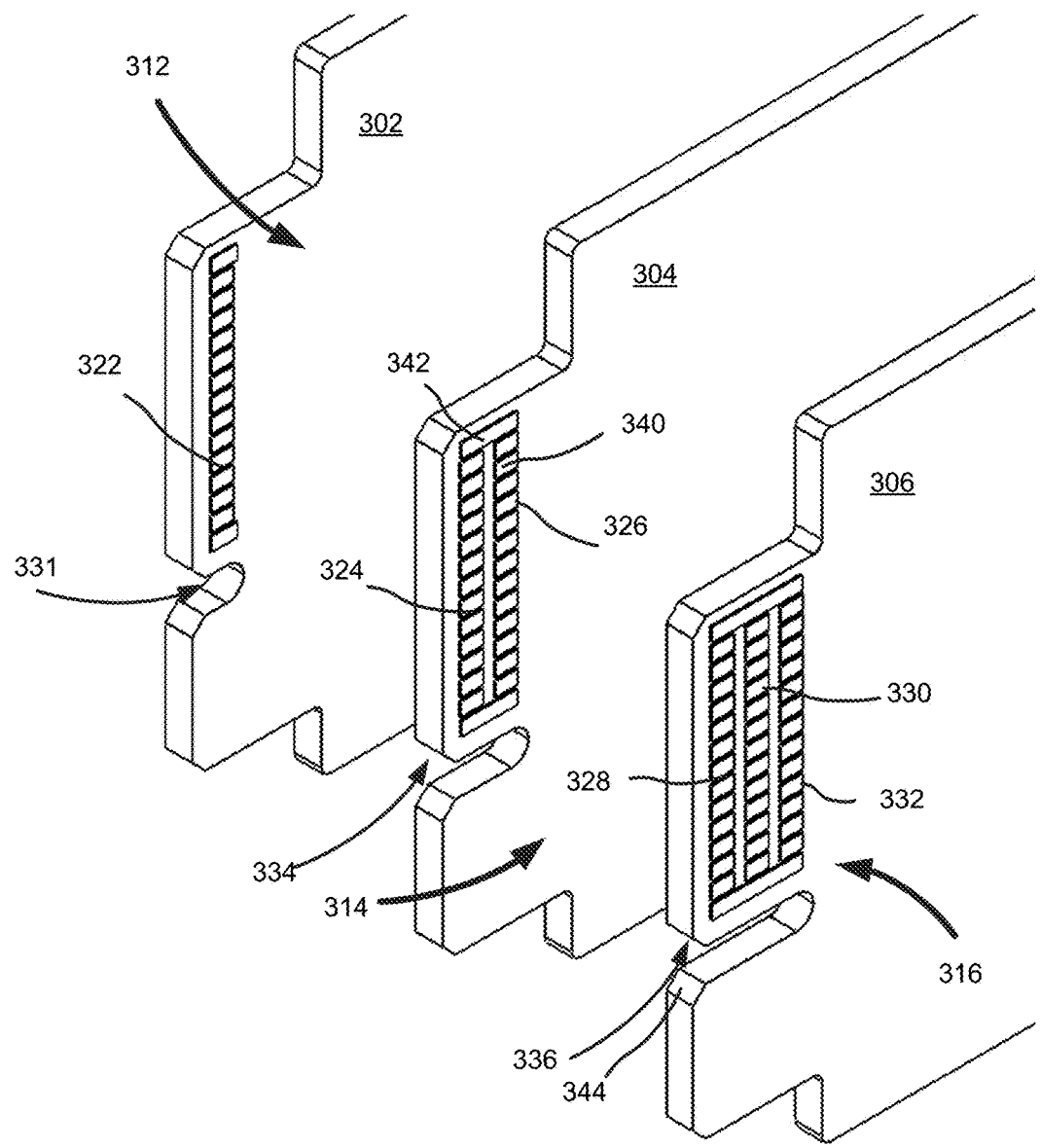
FIG. 3 illustrates a perspective view of a memory card, to be disposed in the system of FIG. 1, in accordance with some embodiments.

FIG. 3 illustrates a perspective view of a memory card, to be disposed in the system of FIG. 1, in accordance with some embodiments. As noted in reference to FIGS. 1-2, a memory card (PCB) 110 may be provided in an elongated, ruler-like shape. Three memory cards (PCB) 302, 304, 306 are shown in FIG. 3 for purposes of illustration.

The memory cards (PCB) 302, 304, 306 may include respective mating ends 312, 314, 316, to provide for insertion of the PCB 302, 304, 306 in respective connectors (not shown in FIG. 3). The mating ends 312, 314, 316 may include one or more groups of contacts 322, 324, 326, 328, 330, 332 arranged around the mating ends 312, 314, 316, to engage respective contacts of the connector in response to an insertion of the PCB into the connector as will be described below. As shown, the groups of contacts may comprise rows of contacts (e.g., contact pads, traces, or the like) disposed adjacent each other at the mating ends 312, 314, 316. For example, groups (e.g., rows or columns) of contacts 328, 330, and 332 may be disposed along the edge of the mating end 316 adjacent each other, as shown.

The groups of contacts in FIG. 3 are shown as arranged on the mating ends substantially vertically, e.g., in columns. However, different arrangements (e.g., in horizontal rows) are possible. Hereinafter, the term "row" will be used to indicate a vertical or horizontal disposition of a group of contacts, for ease of description.

The contacts may include individual contacts 340 used for data communication and shared contacts 342, common for the groups (rows or columns) of contacts, to be used for common purposes, such as power supply, grounding, or the like.

In embodiments, the mating ends 312, 314, 316 may further include respective notches 331, 334, 336 formed on the mating ends 312, 314, 316 of the PCB 302, 304, 306, to mate with the connector in response to the insertion of the PCB into the connector. In embodiments, the edges of the notches may have a particular profile (e.g., 344 of the notch 336), to match a corresponding profile of the connector portion, as described below.

Figure 4:
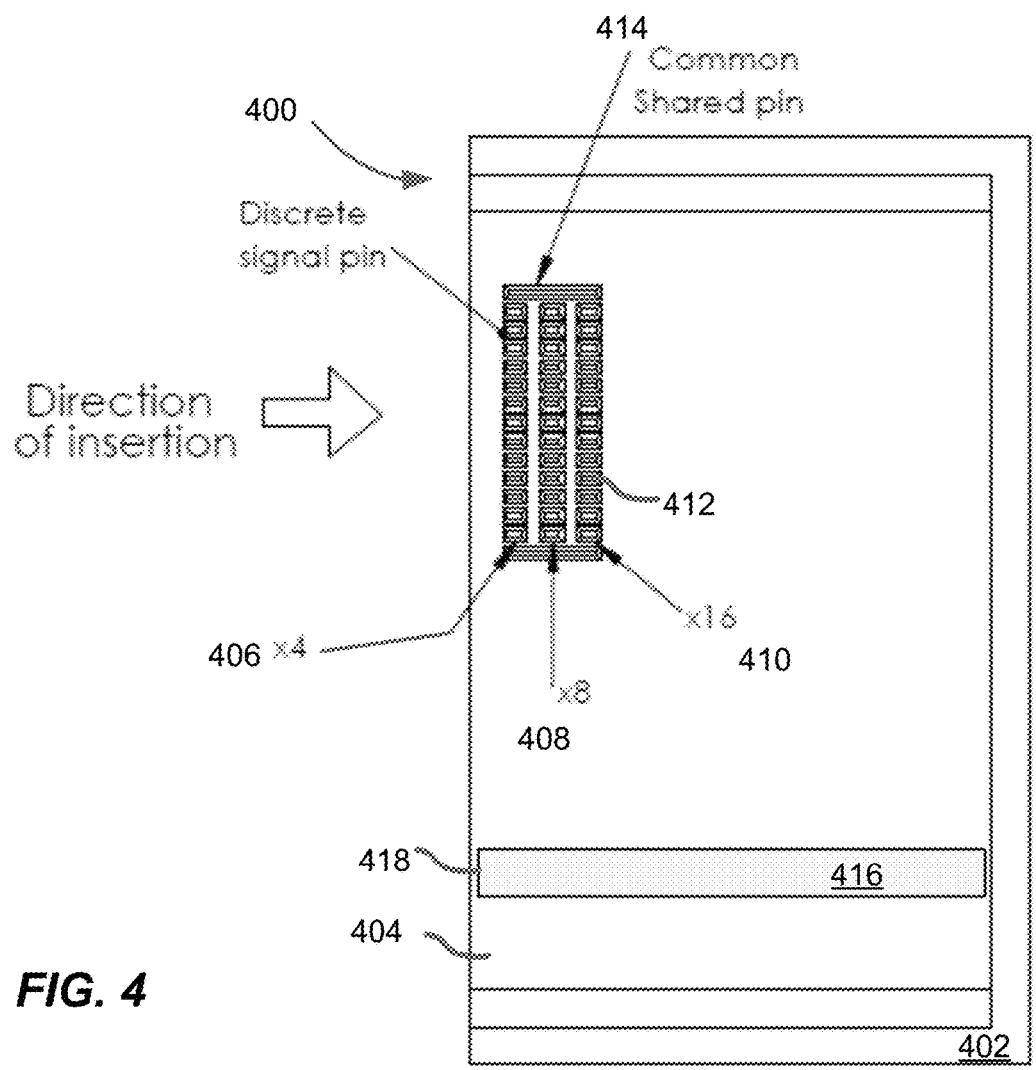
FIG. 4 is a side cross-sectional view of a connector to be used in the system of FIG. 1, in accordance with some embodiments.

FIG. 4 is a side cross-sectional view of a connector to be used in the system of FIG. 1, in accordance with some embodiments. In embodiments, the connector 400 may include a housing 402, a portion of which is shown in FIG. 4. The housing 402 may comprise two or more walls forming a cavity (not shown in FIG. 4), to receive a respective mating end, e.g., 312, of a memory card (PCB), e.g., 302. The walls may have inside portions 404, one of which is shown in FIG. 4. The connector 400 may include one or more groups of contacts 406, 408, 410 arranged along the inside wall 404, to engage with respective groups of contacts arranged around the mating end of the memory card (PCB). As shown, the groups of contacts may be arranged on the inside wall 404 in rows, similar to the contact arrangements of memory cards in FIG. 3. The groups of contacts may provide for different switch bus (e.g., PCIe bus) widths, and therefore for different levels of connectivity of the memory card with a respective component of the computing system (e.g., PCIe switch). For example, the group of contacts 406 may provide for x4 connectivity, groups 406 and 408 may provide for x8 connectivity, and groups 406, 408, and 410 may provide for x6 connectivity, if engaged with respective groups of contacts on the memory card (PCB). In embodiments, the contacts (e.g., 412) in the contact group may comprise discrete signal pins. These pins may be used for discrete single ended and differential input/output used for data information exchange between the memory and other components of the computing system (e.g., compute nodes).

In embodiments, the connector 400 may include a bar 416 disposed inside the connector to bridge the walls of the connector. The bar 416 may be configured to be received by a notch formed on the mating end of the PCB (see FIG. 3). In embodiments, the bar 416 may be provided with a key profile formed on the edge 418 of the bar, to mate with a corresponding profile of the mating end of the PCB.

Similar to the contact arrangements of the memory cards (FIG. 3), the contact groups 406, 408, 410 may have one or more common shared contacts (pins) 414. The shared pins may be used to communicate signals that are common across all different modes of operation. For example, the shared pins may provide for power delivery to a memory card, and signal integrity, isolation, or signal return (ground). Other uses of the shared pins may include a detection of a memory card insertion, a type of memory card inserted, or the like.

FIG. 5 illustrates an example configuration of contacts in the connector of FIG. 4, in accordance with some embodiments. As shown, the contacts 500 (corresponding to the contact groups 406, 408, and 410 as shown in FIG. 4) may have an area 502 of discrete contacts (e.g., pins) responsible for data exchange and an area 504 of common (shared) contacts, which may serve as ground (GND), detection (PRESENT), and power supply (PWR) to a memory card insertable into the connector 400.

The host system may detect that a memory card (PCB) has been inserted into the connector slot, and after this, may ascertain what bus depth and/or speed capabilities the newly inserted card supports. To this effect the connector 400 may have a number of discrete pins earmarked for presence and mode detection, as described above.

Upon insertion, the memory card (PCB) may engage the PRESENT pin, which may trigger the host system to recognize that a card has been plugged into the slot. Then, the PCB may only engage mode detect pins that correspond to the supported mode, i.e., if the card only supports x4 and x8 mode, it will engage the x8 and x4 mode pins. The host system may monitor these pins and, after a fixed amount of time after the initial card insertion has been detected, it may perform a read of the status of the mode pins to assess which type of card is now inserted into the connector 400. Subsequent figures illustrate various embodiments of engagement of memory cards with the connector.

Figure 6:
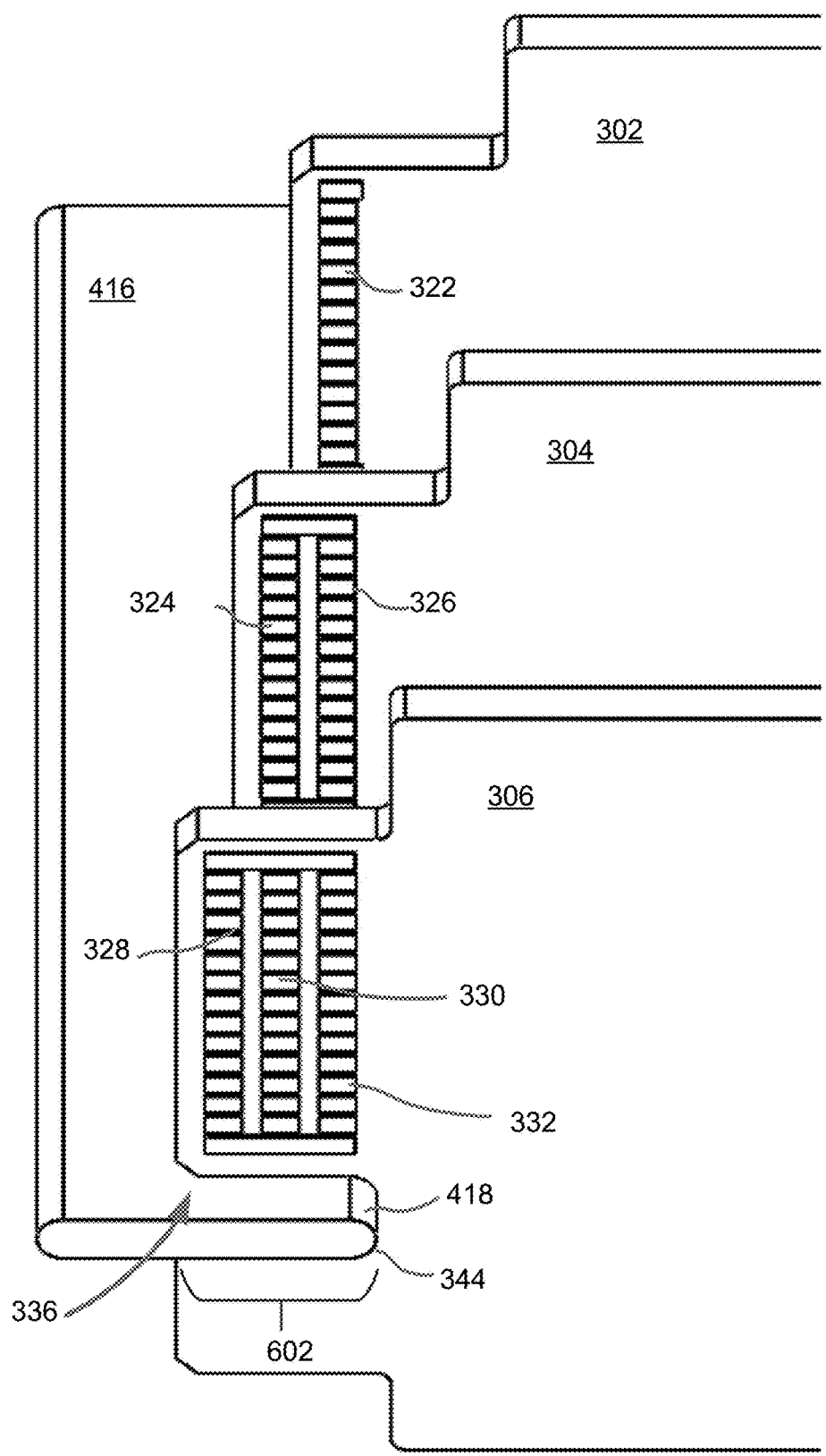
FIG. 6 illustrates some aspects of engagement of memory cards (PCB) with a connector, in accordance with some embodiments.

FIG. 6 illustrates some aspects of engagement of memory cards (PCB) with a connector, in accordance with some embodiments. Specifically, FIG. 6 shows memory cards (PCB) 302, 304, 306 (FIG. 3) engaged with a portion of the connector 400 (FIG. 4), namely with the bar 416. As shown, the bar 416 may engage with respective notches of the memory cards (PCB) 302, 304, 306, for example, with notch 336 of the card 306. As shown, the insertion depth of the memory card into the connector may be controlled by the depth of the notch. For example, the depth 602 of the notch 336 allows for the insertion of the memory card 306 into the connector 400 by engagement with the bar 416, wherein the contact groups 328, 330, 332 may engage with respective contact groups 406, 408, 410 of the connector 400 (FIG. 4).

Similarly, the depths of the notches of memory cards 302 and 304 may allow for engagement of the contact group 322 with respective contact group 406 (card 302) and for engagement of the contact groups 324 and 326 with respective contact groups 406 and 408 (card 304). Understandably, the depth 602 of the notch 336 of the card 306 is greater than the depth of the notch 334 of the card 304, and the depth of the notch 334 of the card 304 is greater than the depth of the notch 331 of the card 302.

As described above, when the card is inserted in the connector, the key profile (edge) 418 of the connector's bar 416 may be engaged with a profile of a corresponding notch (e.g., profile 344 of the notch 336), to provide for mating of the connector with a respective memory card.

Figure 7:
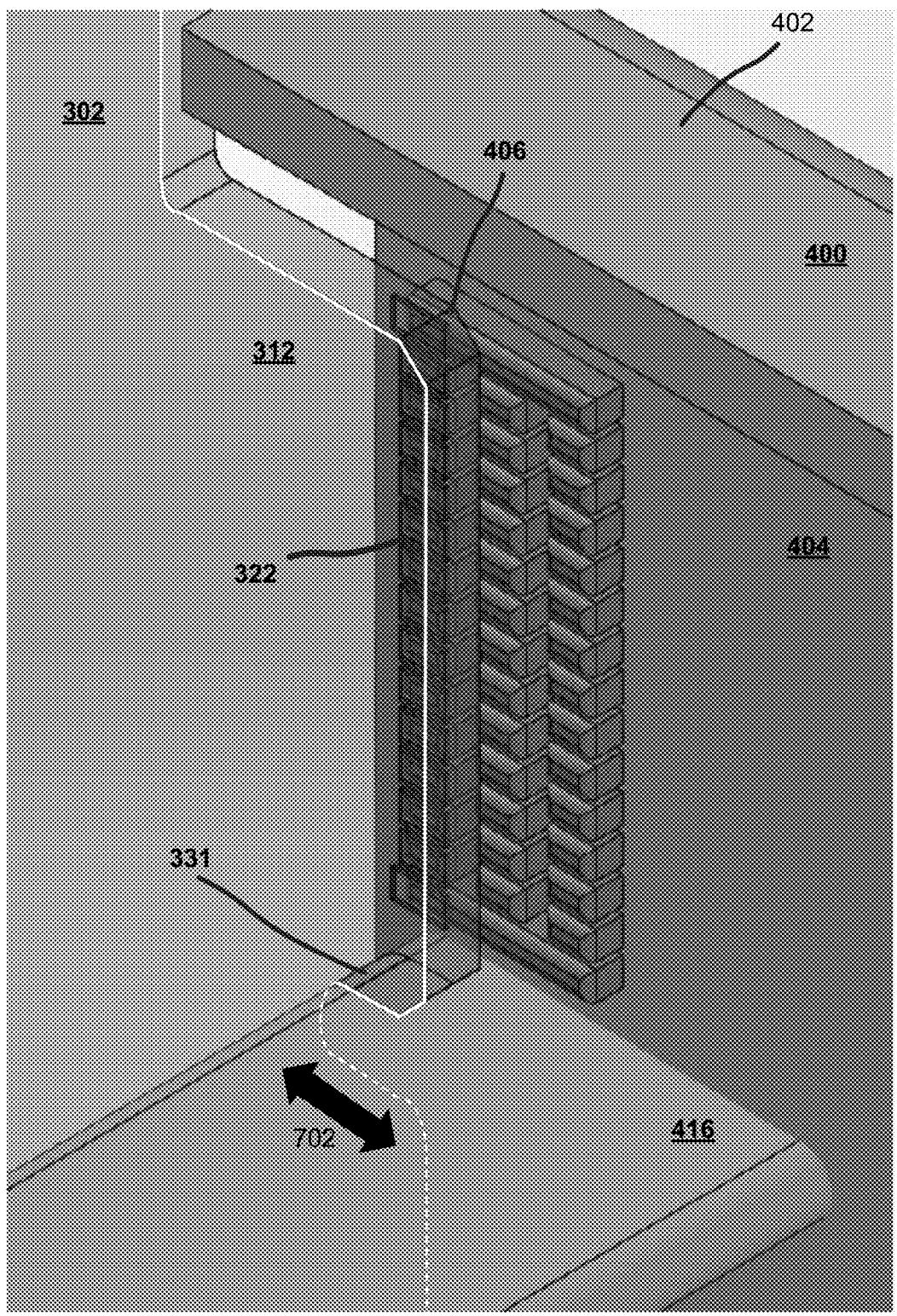
FIGS. 7-9 illustrate partially transparent perspective views of example memory cards engaged with a connector, in accordance with some embodiments.
Figure 8:
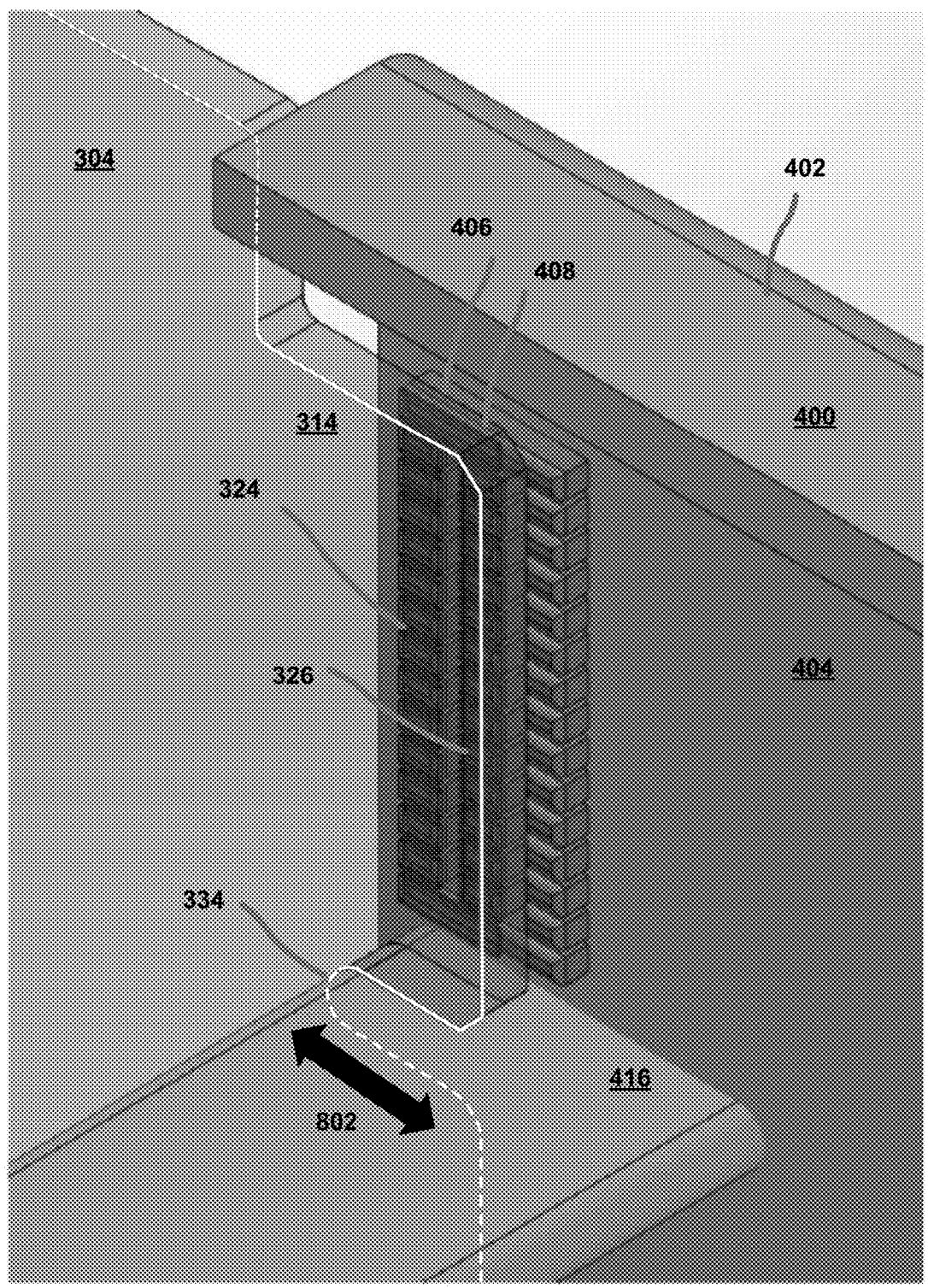
Figure 9:
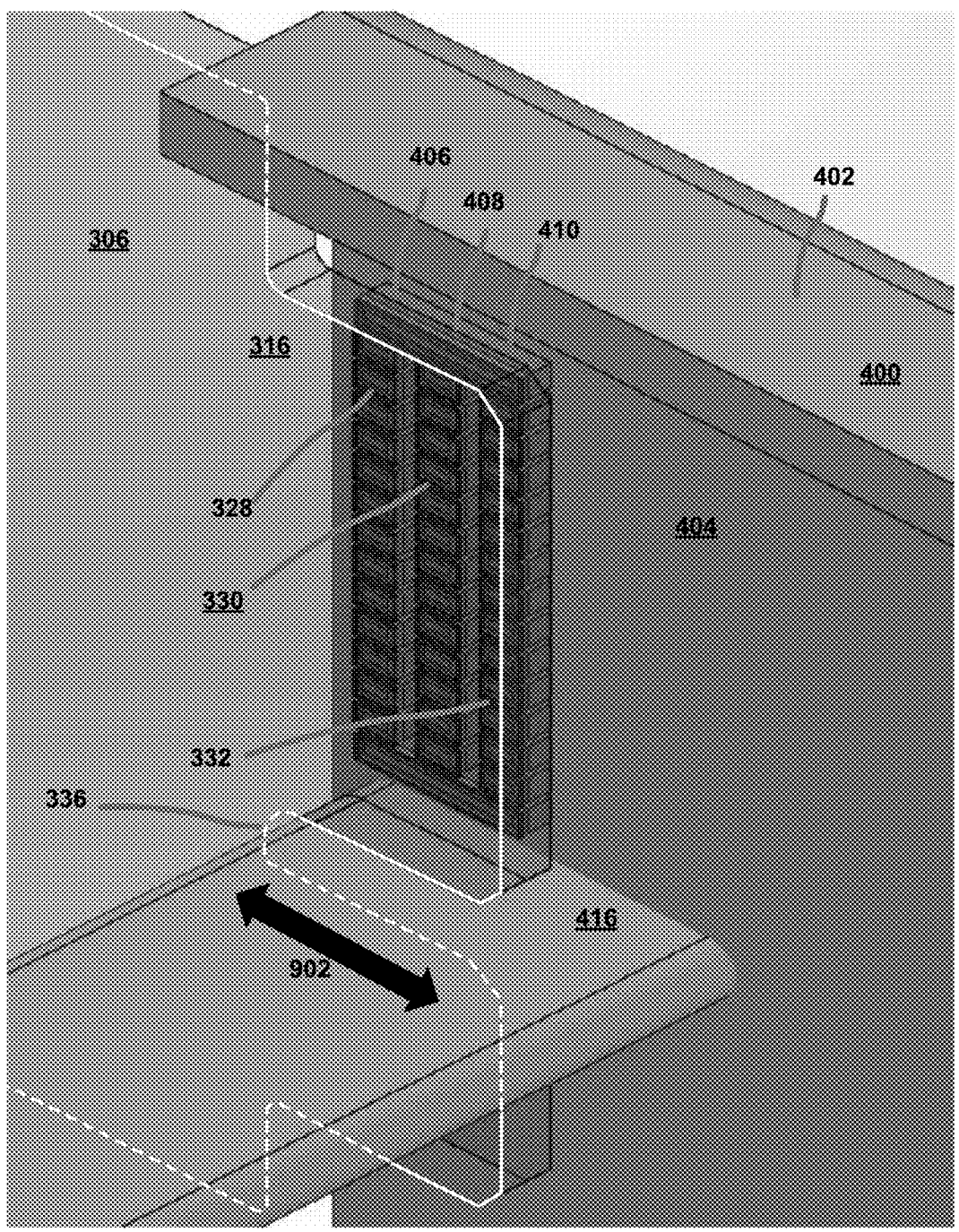

FIGS. 7-9 illustrate partially transparent perspective views of example memory cards engaged with a connector, in accordance with some embodiments. More specifically, FIG. 7 shows the memory card 302 inserted in the connector 400 (the portion of which is shown), providing for x4 connectivity of the memory card 302 with another component of the computing system (e.g., a PCIe switch). As shown, the housing 402 of the connector 400 may be configured to receive the mating end 312 of the memory card 302 (an invisible portion of which is indicated with a dashed line). The depth 702 of the notch 331 may provide for engagement of the card 302 with the bar 416 of the connector 400, and for corresponding engagement of the contact group 322 of the card 302 with respective contact group 406 disposed on the inside wall 404 of the connector 400, thus providing for x4 connectivity for the card 302.

FIG. 8 shows the memory card 304 inserted in the connector 400 (the portion of which is shown), providing for x8 connectivity of the memory card 304 with another component of the computing system (e.g., a PCIe switch). As shown, the housing 402 of the connector 400 may be configured to receive the mating end 314 of the memory card 304 (an invisible portion of which is indicated with a dashed line). The depth 802 of the notch 334 may provide for engagement of the card 304 with the bar 416 of the connector 400, and for corresponding engagement of the contact groups 324 and 326 of the card 302 with respective contact groups 406 and 408 disposed on the inside wall 404 of the connector 400, thus providing for x8 connectivity for the card 304.

In some embodiments, the depth of the notch on the memory card may be the same, regardless of connectivity required for the card (e.g., x4, x8, x16, etc.). In these embodiments, at least some (or all) memory cards in the memory card zone 120 of the system 100 (FIGS. 1-2) may have the same number of contact groups. For example, a memory card may look like the memory card 306 with contact groups 328, 330, and 332 (or more) and may be inserted into the connector 400, engaging the bar 416 as shown in FIG. 6. The number (one or more) of contact groups to be engaged with the corresponding groups of the connector to provide a desired connectivity (e.g., x4, x8, x16 or more) may be determined programmatically.

For example, using one or more of the available detection pins the card may be identified as a special case card that may support various modes. In embodiments, such card may have a card edge that may be configured via alternative firmware and/or software methods. If three pins are available for the card type identification, there may be up to eight total different configuration cases that may be identified. Also, The PCIe standard covers the case where the host and device may configure the bus to operate at whatever bandwidth is deemed adequate by the application or the user. A combination of the above-described methods may be applied to determine the number of contact groups to engage with the corresponding groups of the connector.

FIG. 9 shows the memory card 304 inserted in the connector 400 (the portion of which is shown), providing for x8 connectivity of the memory card 306 with another component of the computing system (e.g., a PCIe switch). As shown, the housing 402 of the connector 400 may be configured to receive the mating end 316 of the memory card 306 (an invisible portion of which is indicated with a dashed line). The depth 902 of the notch 336 may provide for engagement of the card 306 with the bar 416 of the connector 400, and for corresponding engagement of the contact groups 328, 330, and 332 of the card 306 with respective contact groups 406, 408, and 410 disposed on the inside wall 404 of the connector 400, thus providing for x16 connectivity for the card 306.

Figure 10:
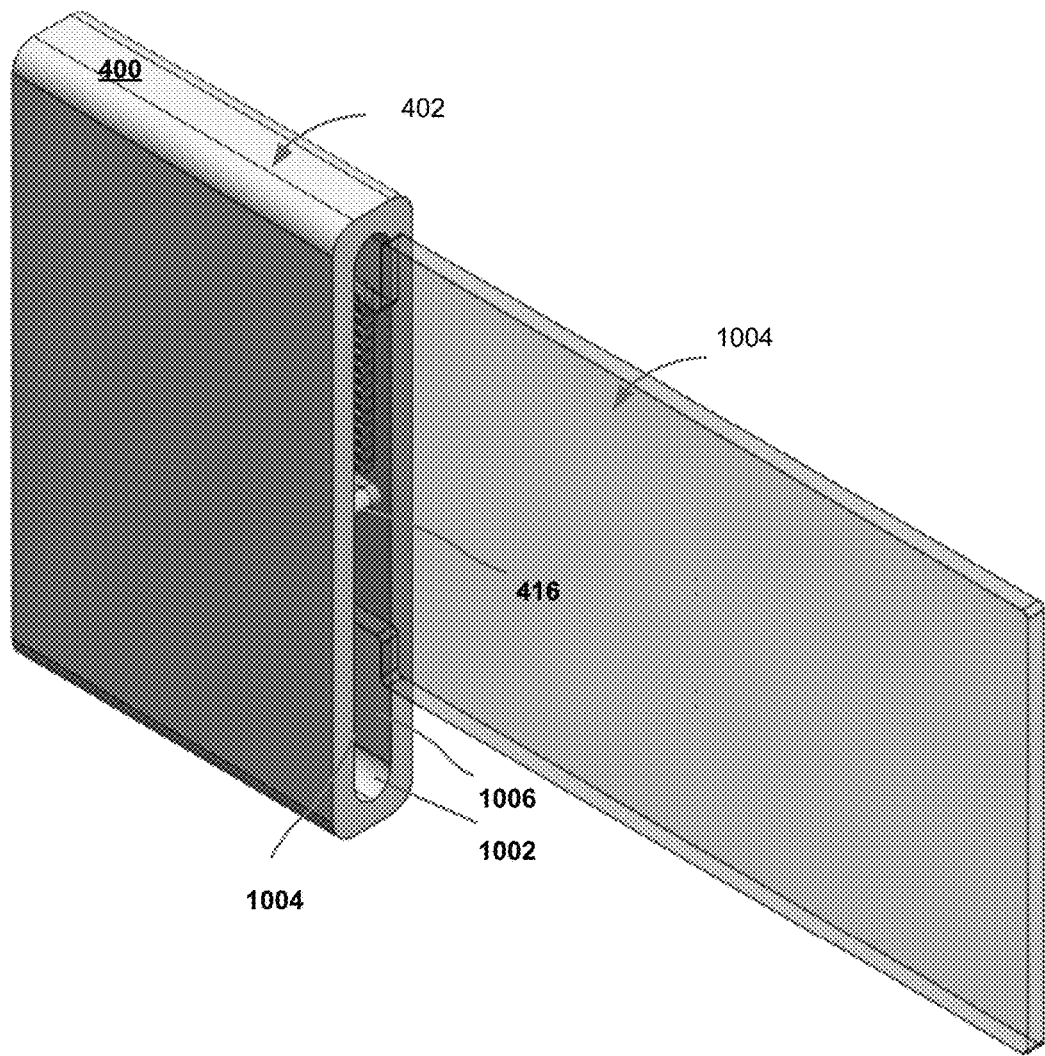
FIGS. 10-12 illustrate various views of example memory cards engaged with a connector, in accordance with some embodiments.
Figure 11:
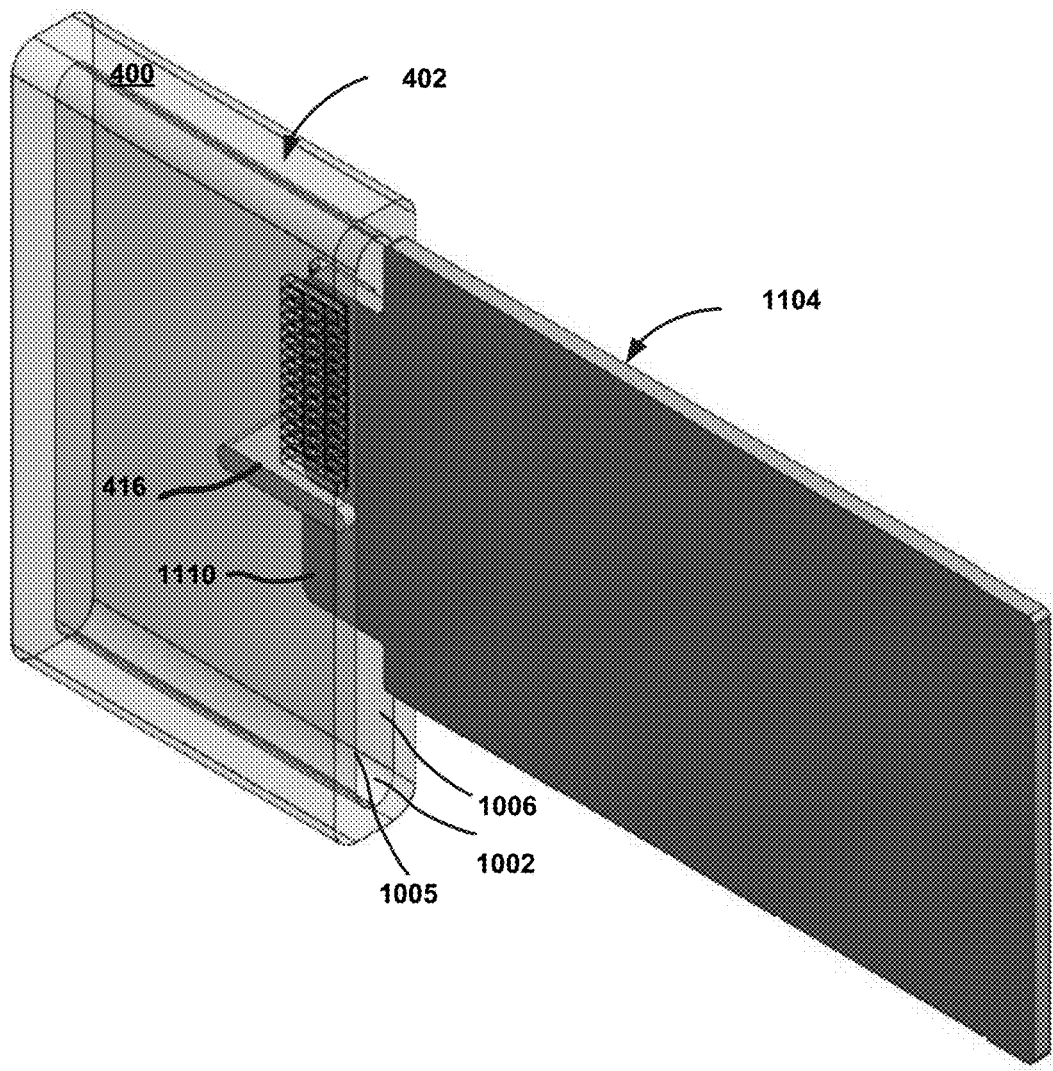
Figure 12:
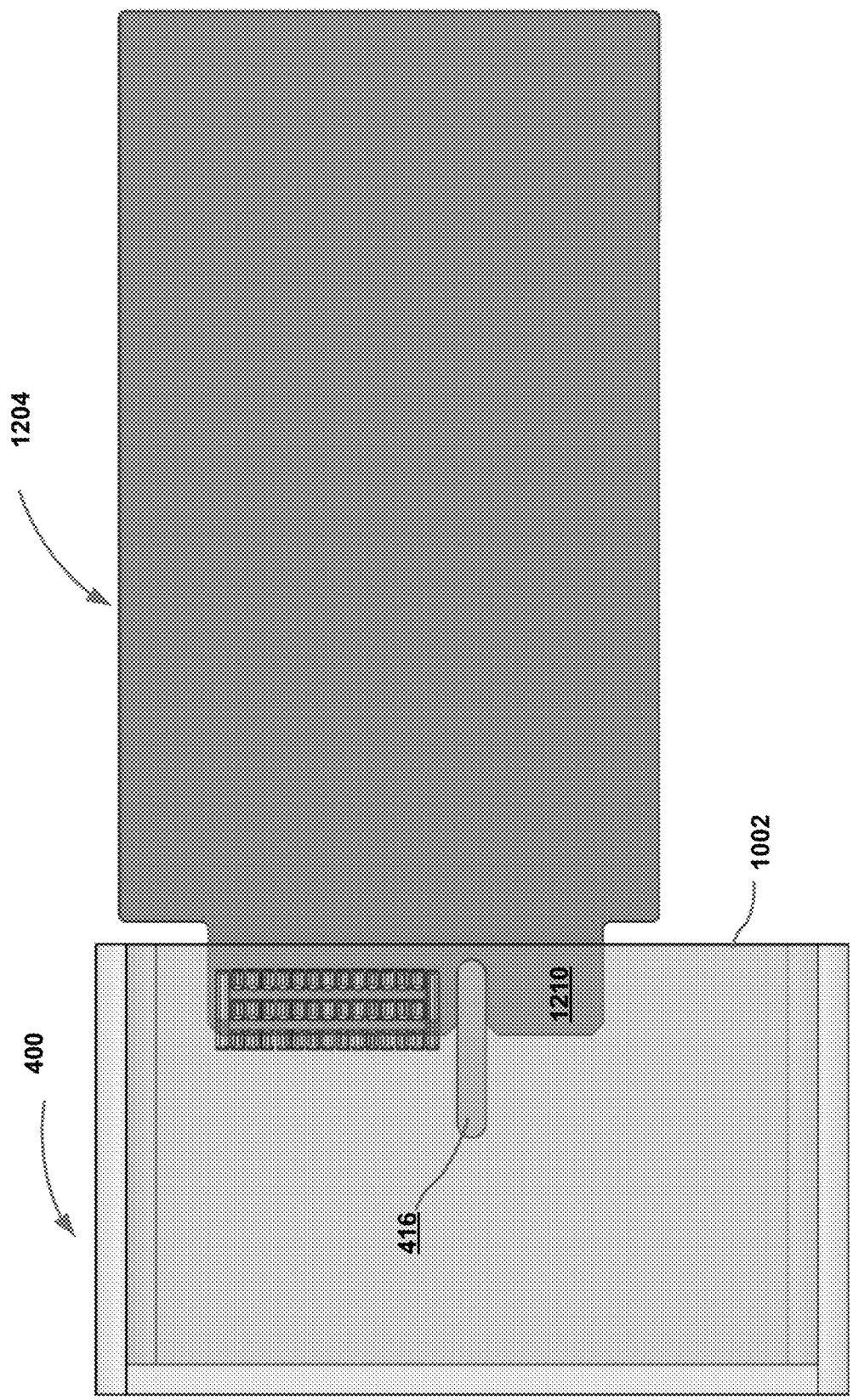

FIGS. 10-12 illustrate various views of example memory cards engaged with a connector, in accordance with some embodiments. FIGS. 10 and 11 show perspective views of the card inserted in the connector, and FIG. 12 shows a side view of the memory card inserted into the connector. FIGS. 11 and 12 provide transparent views of the connector for ease of understanding. As shown in FIGS. 10-12, the housing 402 of the connector 400 may form a cavity 1002 configured to receive a mating end of a memory card 1004 (1104, 1204). The mating ends 1110 and 1210 of the cards 1104 and 1204 are visible inside the transparently rendered connector 400 in FIGS. 11 and 12. The bar 416 may be disposed inside the cavity 1002 to bridge the cavity, e.g., connect inner walls 1005 and 1006 of the housing 402. As shown in FIGS. 11-12, the bar 416 may be disposed substantially perpendicularly to the inner walls 1005 and 1006 and may extend at least partially inside the cavity 1002.

The described embodiments provide for the following advantages. The connector embodiments described herein allow for various PCIe bus widths to be accommodated, without compromising the connector height and/or the pin pitch, by allowing multiple groups (rows or columns) of contacts. The notch depth on the PCIe gold fingers on the memory card may control and indicate the connectivity option: x4, x8, x16, etc. Further, the connectors described herein may provide robust power delivery options in the form of bus-bars or thick gauged, multiple ganged pins for power delivery. Also, the connectors according to the described embodiments may enjoy excellent airflow characteristics.

Figure 13:
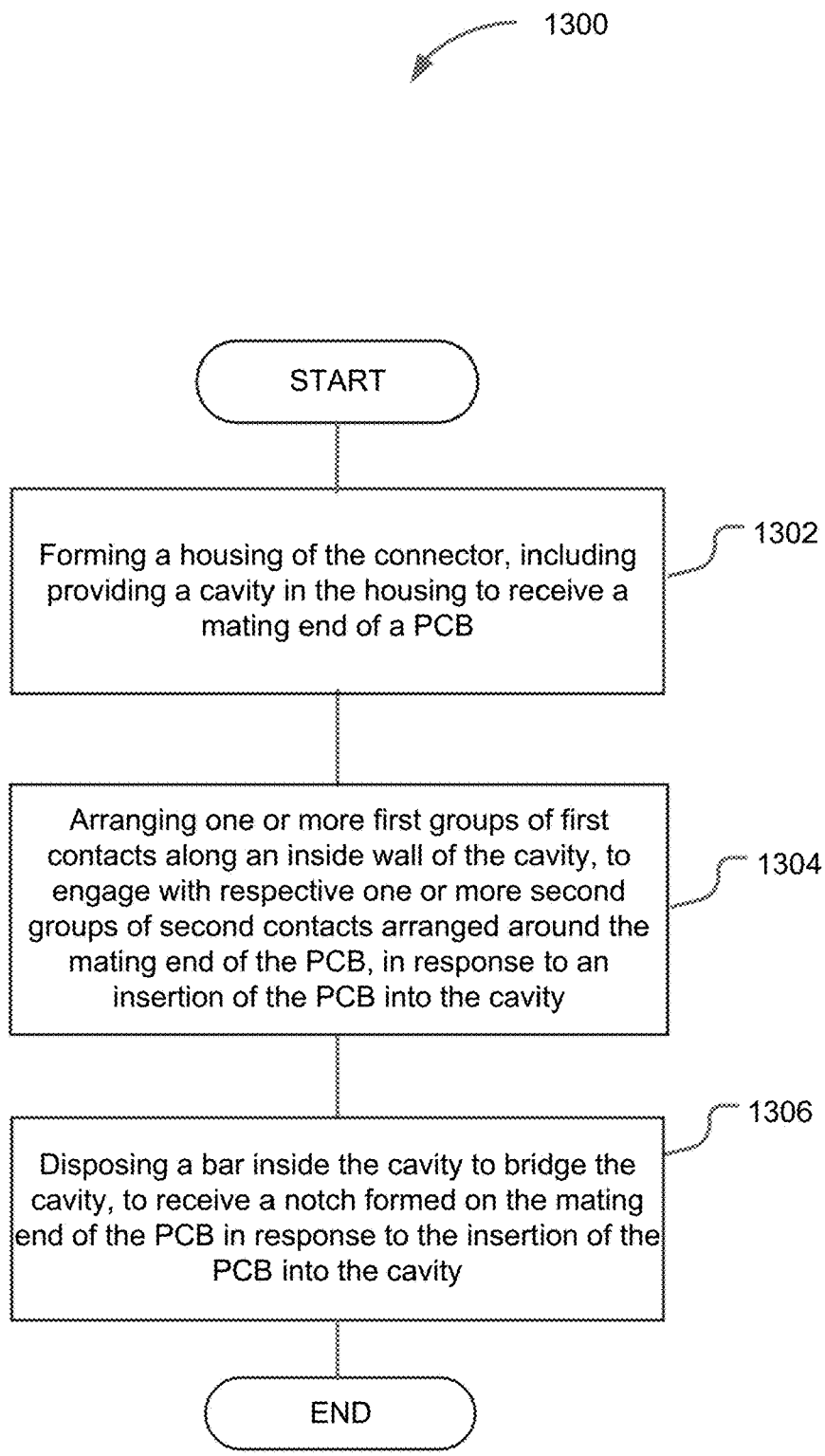
FIG. 13 is a process flow diagram for providing a connector for a computing system, in accordance with some embodiments.

FIG. 13 is a process flow diagram for providing a connector for a computing system, in accordance with some embodiments. The process 1300 may comport with actions described in connection with FIGS. 1-12 in some embodiments. The application of the process 1300 to formation of a connector is provided for purposes of illustration and for ease of understanding.

At block 1302, the process 1300 may include forming a housing of a connector, which may include providing a cavity in the housing to receive a mating end of a memory card (PCB).

At block 1304, the process 1300 may further include arranging one or more first groups of first contacts along an inside wall of the cavity, to engage with respective one or more second groups of second contacts arranged around the mating end of the PCB, in response to an insertion of the PCB into the cavity. This may include arranging the first groups in multiple rows or columns of first contacts, adjacent each other. Arranging the first groups of first contacts may further include providing one or more shared contacts, common for the one or more first groups, to provide a power supply or grounding for the PCB; and providing a plurality of discrete signal contacts to form the one or more first groups, to provide for data information exchange between the PCB and another component of the computing system.

At block 1306, the process 1300 may further include disposing a bar inside the cavity to bridge the cavity, to receive a notch formed on the mating end of the PCB in response to the insertion of the PCB into the cavity. Disposing the bar inside the cavity may include placing the bar inside the cavity substantially perpendicularly to the inside wall of the cavity. In embodiments, the bar may include a key profile to mate a corresponding profile of the mating end of the PCB.

Various operations of the process 1300 are described as multiple discrete operations, in a manner that is most helpful in understanding the claimed subject matter. However, the order of description should not be construed as to imply that these operations are necessarily order dependent. It will be appreciated that the sequence of operations associated with the process 1300 may vary and/or include other actions in accordance with the present disclosure.

The memory arrays and methods described herein may be implemented into a system using any suitable hardware and/or software to configure as desired.

Figure 14:
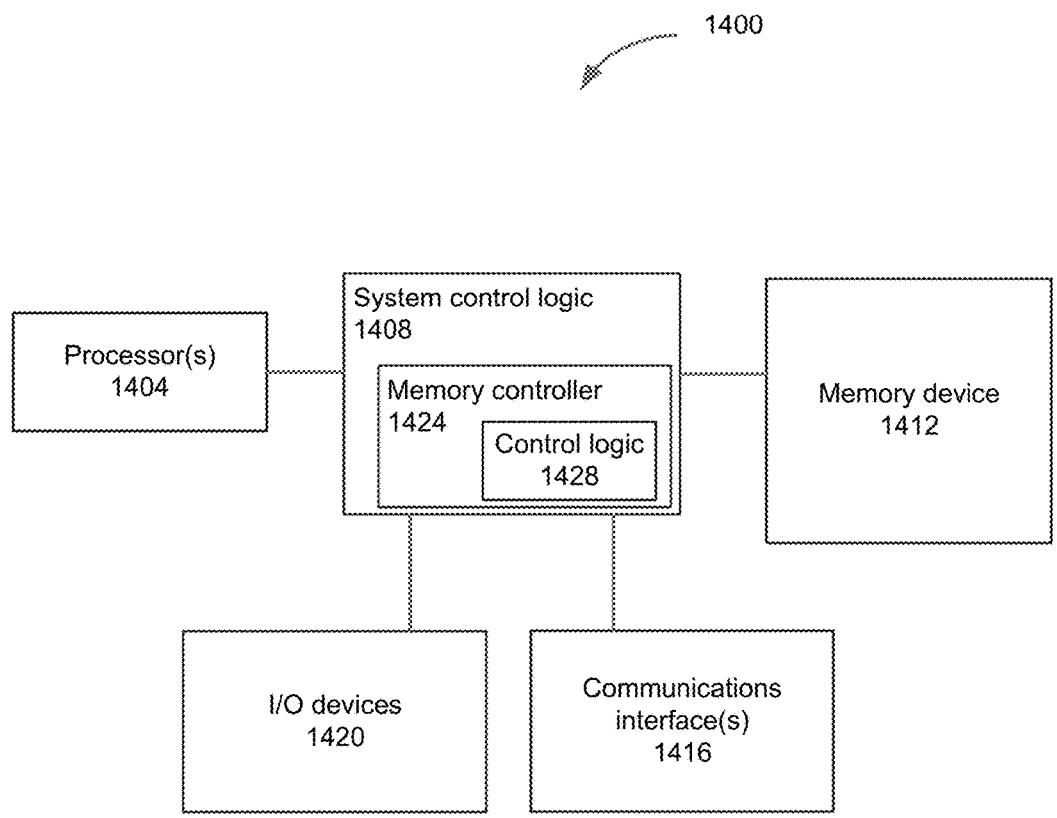
FIG. 14 schematically illustrates an example computing device including memory cards engaged with connectors described in FIGS. 4-13, in accordance with some embodiments.

FIG. 14 schematically illustrates an example computing device including memory cards engaged with connectors described in FIGS. 4-13, in accordance with some embodiments. The computing device 1400 may include system control logic 1408 coupled to one or more processor(s) 1404; a memory device 1412; one or more communications interface(s) 1416; and input/output (I/O) devices 1420.

In some embodiments, the memory device 1412 may be a non-volatile computer storage chip. In some embodiments, the memory device 1412 may comprise disaggregated storage system 100 of FIG. 1, having a plurality of memory cards (PCB) with connectors as described in reference to FIGS. 2-13. The memory device may further include driver circuitry (e.g., drivers), input/output connections to electrically couple the memory device 1412 with other components of the computing device 1400, etc. The memory device 1412 may be configured to be removably or permanently coupled with the computing device 1400.

Communications interface(s) 1416 may provide an interface for computing device 1400 to communicate over one or more network(s) and/or with any other suitable device. Communications interface(s) 1416 may include any suitable hardware and/or firmware. Communications interface(s) 1416 for one embodiment may include, for example, a network adapter, a wireless network adapter, a telephone modem, and/or a wireless modem. For wireless communications, communications interface(s) 1416 for one embodiment may use one or more antennas to communicatively couple the computing device 1400 with a wireless network.

For one embodiment, at least one of the processor(s) 1404 may be packaged together with logic for one or more controller(s) of system control logic 1408. For one embodiment, at least one of the processor(s) 1404 may be packaged together with logic for one or more controllers of system control logic 1408 to form a System in Package (SiP). For one embodiment, at least one of the processor(s) 1404 may be integrated on the same die with logic for one or more controller(s) of system control logic 1408. For one embodiment, at least one of the processor(s) 1404 may be integrated on the same die with logic for one or more controller(s) of system control logic 1408 to form a System on Chip (SoC).

System control logic 1408 for one embodiment may include any suitable interface controllers to provide for any suitable interface to at least one of the processor(s) 1404 and/or to any suitable device or component in communication with system control logic 1408. The system control logic 1408 may move data into and/or out of the various components of the computing device 1400.

System control logic 1408 for one embodiment may include a memory controller 1424 to provide an interface to the memory device 1412 to control various memory access operations. The memory controller 1424 may include control logic 1428 that may be specifically configured to control access of the memory device 1412.

In various embodiments, the I/O devices 1420 may include user interfaces designed to enable user interaction with the computing device 1400, peripheral component interfaces designed to enable peripheral component interaction with the computing device 1400, and/or sensors designed to determine environmental conditions and/or location information related to the computing device 1400. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 1416 to communicate with components of a positioning network, e.g., a global positioning system (GPS) satellite.

In embodiments, the computing device 1400 may comprise a data center. In various embodiments, the computing device 1400 may comprise a workstation, a server, or a cluster of servers (server farm). The computing device 1400 may have more or fewer components, and/or different architectures. In further implementations, the computing device 1400 may be any other electronic device that processes data.

According to various embodiments, the present disclosure describes a number of examples.

Example 1 may be a connector for a computing system, comprising: a housing having a cavity to receive a mating end of a printed circuit board (PCB), wherein the cavity includes: one or more first groups of first contacts arranged along an inside wall of the cavity, to engage with respective one or more second groups of second contacts arranged around the mating end of the PCB; and a bar disposed inside the cavity to bridge the cavity, to be received by a notch formed on the mating end of the PCB, wherein a depth of the notch defines a number of the first groups of first contacts to be engaged with a respective number of the second groups of second contacts on the mating end of the PCB.

Example 2 may include the connector of example 1, wherein the first contacts comprise pins, and second contacts comprise pads or traces.

Example 3 may include the connector of example 1, wherein the first contacts include: one or more shared contacts, common for the one or more first groups, to provide a power supply or grounding for the PCB; and a plurality of discrete signal contacts, to provide for data information exchange between the PCB and another component of the computing system.

Example 4 may include the connector of example 3, wherein the one or more shared contacts are to further provide for a detection of an insertion of the PCB into the cavity.

Example 5 may include the connector of example 1, wherein the one or more first groups comprise multiple rows of the first contacts, wherein the rows of the first contacts are disposed on the inside wall of the cavity adjacent each other, wherein the one or more second groups comprise at least one row of the second contacts, to engage a respective one of the multiple rows of first contacts in response to an insertion of the PCB into the cavity of the connector.

Example 6 may include the connector of example 5, wherein each of the first groups comprises a row of the first contacts, and each of the second groups comprises a row of the second contacts.

Example 7 may include the connector of example 1, wherein the bar comprises a key profile to mate a corresponding profile of the mating end of the PCB.

Example 8 may include the connector of example 7, wherein the bar is disposed inside the cavity substantially perpendicularly to the inside wall of the cavity.

Example 9 may include the connector of any of examples 1 to 8, wherein the PCB comprises an All Flash Array (AFA) solid state drive (SSD) memory device, wherein the connector comprises a Peripheral Component Interconnect Express (PCIe) bus, to connect the memory device with other components of the computing system, wherein the other components include a PCIe switch.

Example 10 may include the connector of example 1, wherein the computing system comprises a data center or a server.

Example 11 may be a computing system, comprising: a connector having a housing with a cavity, wherein the cavity includes one or more first groups of first contacts arranged along an inside wall of the cavity, and a bar disposed inside the cavity to bridge the cavity; and a printed circuit board (PCB) having a mating end insertable in the connector, wherein the mating end includes one or more second groups of second contacts arranged around the mating end, to engage respective one or more first groups of first contacts in response to an insertion of the PCB into the cavity of the connector, and a notch formed on the mating end of the PCB, to receive the bar in response to the insertion of the PCB into the cavity; wherein a depth of the notch defines a number of the first groups of first contacts to be engaged with a respective number of the one or more groups of second contacts on the mating end of the PCB in response to the insertion of the PCB into the cavity.

Example 12 may include the computing system of example 11, wherein the first contacts comprise pins, and the second contacts comprise pads or traces.

Example 13 may include the computing system of example 11, wherein the one or more groups of first contacts includes: one or more shared contacts, common for the one or more first groups, to provide a power supply, or grounding for the PCB, or a detection of an insertion of the PCB inside the cavity; and a plurality of discrete signal contacts, to provide for data information exchange between the PCB and another component of the computing system.

Example 14 may include the computing system of example 11, wherein the one or more first groups comprise multiple rows of the first contacts, wherein the rows of the first contacts are disposed on the inside wall of the cavity adjacent each other, wherein the one or more second groups comprise at least one row of the second contacts, to engage a respective one of the multiple rows of first contacts in response to an insertion of the PCB into the cavity of the connector.

Example 15 may include the computing system of example 11, wherein the bar comprises a key profile to mate a corresponding profile of the mating end of the PCB, wherein the bar is disposed inside the cavity substantially perpendicularly to the inside wall of the cavity.

Example 16 may include the computing system of example 15, wherein the PCB is to be inserted into the cavity substantially perpendicular to the bar.

Example 17 may include the computing system of any of examples 11 to 16, wherein the computing system comprises a data center or a server, wherein the PCB comprises an All Flash Array (AFA) solid state drive (SSD) memory device, wherein the connector comprises a Peripheral Component Interconnect Express (PCIe) bus, to connect the memory device with other components of the computing system, wherein the other components include a PCIe switch.

Example 18 may be a method for providing a connector for a computing system, comprising: forming a housing of the connector, including providing a cavity in the housing to receive a mating end of a printed circuit board (PCB); arranging one or more first groups of first contacts along an inside wall of the cavity, to engage with respective one or more second groups of second contacts arranged around the mating end of the PCB, in response to an insertion of the PCB into the cavity; and disposing a bar inside the cavity to bridge the cavity, to be received by a notch formed on the mating end of the PCB in response to the insertion of the PCB into the cavity, wherein a depth of the notch defines a number of the first groups of first contacts to be engaged with a respective number of the second groups of second contacts on the mating end of the PCB.

Example 19 may include the method of example 18, wherein disposing a bar inside the cavity includes placing the bar inside the cavity substantially perpendicularly to the inside wall of the cavity.

Example 20 may include the method of example 18, wherein arranging one or more first groups of first contacts along an inside wall includes arranging the first groups in multiple rows of first contacts, adjacent each other.

Example 21 may include the method of example 18, further comprising providing a key profile on the bar, to mate with a corresponding profile of the mating end of the PCB.

Example 22 may include the method of any of examples 18 to 21, wherein arranging one or more first groups of first contacts along an inside wall of the cavity includes: providing one or more shared contacts, common for the one or more first groups, to provide a power supply or grounding for the PCB; and providing a plurality of discrete signal contacts to form the one or more first groups, to provide for data information exchange between the PCB and another component of the computing system.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. A connector for a computing system, comprising:
   a housing having a cavity to receive a mating end of a printed circuit board (PCB), wherein the cavity includes:
   one or more first groups of first contacts arranged along an inside wall of the cavity, to engage with respective one or more second groups of second contacts arranged around the mating end of the PCB; and
   a bar disposed inside the cavity to bridge the cavity, to be received by a notch formed on the mating end of the PCB, wherein a depth of the notch defines a number of the first groups of first contacts to be engaged with a respective number of the second groups of second contacts on the mating end of the PCB.

2. The connector of claim 1, wherein the first contacts comprise pins, and second contacts comprise pads or traces.

3. The connector of claim 1, wherein the first contacts include:
  one or more shared contacts, common for the one or more first groups, to provide a power supply or grounding for the PCB; and
  a plurality of discrete signal contacts, to provide for data information exchange between the PCB and another component of the computing system.

4. The connector of claim 3, wherein the one or more shared contacts are to further provide for a detection of an insertion of the PCB into the cavity.

5. The connector of claim 1, wherein the one or more first groups comprise multiple rows of the first contacts, wherein the rows of the first contacts are disposed on the inside wall of the cavity adjacent each other, wherein the one or more second groups comprise at least one row of the second contacts, to engage a respective one of the multiple rows of first contacts in response to an insertion of the PCB into the cavity of the connector.

6. The connector of claim 5, wherein each of the first groups comprises a row of the first contacts, and each of the second groups comprises a row of the second contacts.

7. The connector of claim 1, wherein the bar comprises a key profile to mate a corresponding profile of the mating end of the PCB.

8. The connector of claim 7, wherein the bar is disposed inside the cavity substantially perpendicularly to the inside wall of the cavity, wherein the bar comprises a substantially flat profile, wherein a plane that defines the profile of the bar is substantially perpendicular to a plane that defines the inside wall of the cavity.

9. The connector of claim 1, wherein the PCB comprises an All Flash Array (AFA) solid state drive (SSD) memory device, wherein the connector comprises a Peripheral Component Interconnect Express (PCIe) bus, to connect the memory device with other components of the computing system, wherein the other components include a PCIe switch.

10. The connector of claim 1, wherein the computing system comprises a data center or a server.

11. A computing system, comprising:
  a connector having a housing with a cavity, wherein the cavity includes one or more first groups of first contacts arranged along an inside wall of the cavity, and a bar disposed inside the cavity to bridge the cavity; and
  a printed circuit board (PCB) having a mating end insertable in the connector, wherein the mating end includes one or more second groups of second contacts arranged around the mating end, to engage respective one or more first groups of first contacts in response to an insertion of the PCB into the cavity of the connector, and a notch formed on the mating end of the PCB, to receive the bar in response to the insertion of the PCB into the cavity;
  wherein a depth of the notch defines a number of the first groups of first contacts to be engaged with a respective number of the one or more second groups of second contacts on the mating end of the PCB in response to the insertion of the PCB into the cavity.

12. The computing system of claim 11, wherein the first contacts comprise pins, and the second contacts comprise pads or traces.

13. The computing system of claim 11, wherein the one or more groups of first contacts includes:
  one or more shared contacts, common for the one or more first groups, to provide a power supply, or grounding for the PCB, or a detection of an insertion of the PCB inside the cavity; and
  a plurality of discrete signal contacts, to provide for data information exchange between the PCB and another component of the computing system.

14. The computing system of claim 11, wherein the one or more first groups comprise multiple rows of the first contacts, wherein the rows of the first contacts are disposed on the inside wall of the cavity adjacent each other, wherein the one or more second groups comprise at least one row of the second contacts, to engage a respective one of the multiple rows of first contacts in response to an insertion of the PCB into the cavity of the connector.

15. The computing system of claim 11, wherein the bar comprises a key profile to mate a corresponding profile of the mating end of the PCB, wherein the bar is disposed inside the cavity substantially perpendicularly to the inside wall of the cavity.

16. The computing system of claim 15, wherein the PCB is to be inserted into the cavity substantially perpendicular to the bar, wherein the bar comprises a substantially flat profile, wherein a plane that defines the profile of the bar is substantially perpendicular to a plane that defines the inside wall of the cavity.

17. The computing system of claim 11, wherein the computing system comprises a data center or a server, wherein the PCB comprises an All Flash Array (AFA) solid state drive (SSD) memory device, wherein the connector comprises a Peripheral Component Interconnect Express (PCIe) bus, to connect the memory device with other components of the computing system, wherein the other components include a PCIe switch.

* * * * *